US012123652B2

(12) United States Patent
Wu

(10) Patent No.: US 12,123,652 B2
(45) Date of Patent: Oct. 22, 2024

(54) LIQUID COOLING SYSTEM

(71) Applicant: COOLER MASTER CO., LTD., New Taipei (TW)

(72) Inventor: Yuan Wu, Hui Zhou (CN)

(73) Assignee: COOLER MASTER CO., LTD, New Taipei (TW)

( * ) Notice: Subject to any disclaimer, the term of this patent is extended or adjusted under 35 U.S.C. 154(b) by 35 days.

(21) Appl. No.: 17/087,038

(22) Filed: Nov. 2, 2020

(65) Prior Publication Data
US 2022/0136775 A1 May 5, 2022

(51) Int. Cl.
| | |
|---|---|
| *H05K 7/20* | (2006.01) |
| *F28D 1/02* | (2006.01) |
| *F28D 15/00* | (2006.01) |
| *F28D 17/00* | (2006.01) |
| *F28D 15/06* | (2006.01) |
| *F28D 21/00* | (2006.01) |
| *H01L 23/473* | (2006.01) |

(52) U.S. Cl.
CPC .............. *F28D 1/024* (2013.01); *F28D 15/00* (2013.01); *F28D 17/00* (2013.01); *F28D 15/06* (2013.01); *F28D 2021/0028* (2013.01); *H01L 23/473* (2013.01); *H05K 7/20281* (2013.01)

(58) Field of Classification Search
CPC ........... H05K 7/20254; H05K 7/20509; H05K 7/20272; H05K 7/20281
See application file for complete search history.

(56) References Cited

U.S. PATENT DOCUMENTS

| | | | | |
|---|---|---|---|---|
| 4,829,780 | A | * | 5/1989 | Hughes .................. F28F 17/005 62/288 |
| 5,505,257 | A | * | 4/1996 | Goetz, Jr. ............... F28F 1/105 165/152 |
| 5,529,116 | A | * | 6/1996 | Sasaki ................... F28D 1/0435 165/145 |
| 7,113,404 | B2 | * | 9/2006 | Naganawa ............ F28F 9/0246 165/80.4 |
| 10,048,008 | B1 | * | 8/2018 | Mounioloux ....... F28D 1/05391 |
| 10,959,353 | B2 | * | 3/2021 | Tokeshi ..................... G06F 1/20 |
| 2005/0173097 | A1 | * | 8/2005 | Kitajima ................. F28D 15/00 62/118 |
| 2016/0273852 | A1 | * | 9/2016 | Hayashi ............. H05K 7/20154 |

(Continued)

FOREIGN PATENT DOCUMENTS

CN 110645812 A * 1/2020

*Primary Examiner* — Eric S Ruppert
(74) *Attorney, Agent, or Firm* — Dickinson Wright PLLC

(57) ABSTRACT

A liquid cooling system is provided. The liquid cooling system comprises a radiator having first and second built-in fluid tank reservoirs, a multi-fan unit, at least one heat exchanger pump, and a plurality of fluid conduits. The radiator comprises at least one first flow port and at least one second flow port for attachment of the plurality of fluid conduits thereto for actively moving a cooling fluid to and from the at least one heat exchanger pump. Heat generated from a heat generating device is transferred to cooling fluid flowing through the at least one heat exchanger pump, and then output to the radiator. The heated cooling fluid flows through the radiator having the built-in fluid tank, cooling along a plurality of heat exchanger fins, whereby the multi-fan unit expels heat therefrom. The cooling fluid flows to the heat exchanger pump to once again begin the cooling loop.

20 Claims, 8 Drawing Sheets

(56) References Cited

U.S. PATENT DOCUMENTS

| | | | | |
|---|---|---|---|---|
| 2017/0278773 A1* | 9/2017 | Hwang | ................ | G05D 23/306 |
| 2018/0308786 A1* | 10/2018 | Huang | ................. | H01L 23/467 |
| 2018/0340744 A1* | 11/2018 | Tsai | ......................... | F28F 3/02 |
| 2019/0239388 A1* | 8/2019 | Tsai | ...................... | H01L 23/473 |
| 2021/0305129 A1* | 9/2021 | Chen | ........................ | F28F 1/22 |

* cited by examiner

LIQUID COOLING SYSTEM

TECHNICAL FIELD

Exemplary embodiments relate generally to the field of heat transfer and, more particularly, to liquid cooling systems.

BACKGROUND

During operation of computers, servers or electronics systems, the heat generated by the processors must be dissipated quickly and efficiently to keep operating temperatures within manufacturer recommended ranges. As these electronics systems increase in functionality and applicability so does operating speed of the processors used therein; with an increase in operating speeds and an increase in the number of processors employed, power requirements of the electronics systems also increase, which in turn, increases cooling requirements.

Several techniques have been developed for extracting heat from processors in electronics systems. One such technique is an air-cooling system, wherein a heat sink is in thermal contact with a processor and transports heat away from the processor and a fan is mounted on top of a heat sink to remove heat from the heat sink by blowing air through segments thereof. This air-cooling system may be sufficient for everyday uses; however, it may be noisy and becomes less effective and more cumbersome with higher processor speeds, increased number of processors employed, and greater heat output. Another technique uses cooling fluid to cool a processor by forcing the cooling fluid to circulate inside a closed system by a pumping unit, wherein the closed system may also have a fluid reservoir, a radiator in which the cooling fluid is circulated thereabout and a water block. The water block is typically where the cooling fluid engages in thermal contact with the heat generating processors.

Generally, liquid heat exchange systems may be less noisy and more efficient than air-cooling systems. However, conventional liquid heat exchange system designs consist of many components, which increases total installation time, risks for leakage, and component placement problems. Thus, in some applications, it is necessary to position one or more components on the outside of the electronic device housing, such as, the fluid reservoir; whereby at least one hose is required, from the fluid reservoir on the outside, leading into the electronic device housing and an attachment mechanism to the housing or separated assembly.

BRIEF DESCRIPTION OF THE DRAWINGS

Unless specified otherwise, the accompanying drawings illustrate aspects of the innovative subject matter described herein. Referring to the drawings, wherein like reference numerals indicate similar parts throughout the several views, several examples of heatsink fins incorporating aspects of the presently disclosed principles are illustrated by way of example, and not by way of limitation.

DETAILED DESCRIPTION

Figure 1A:
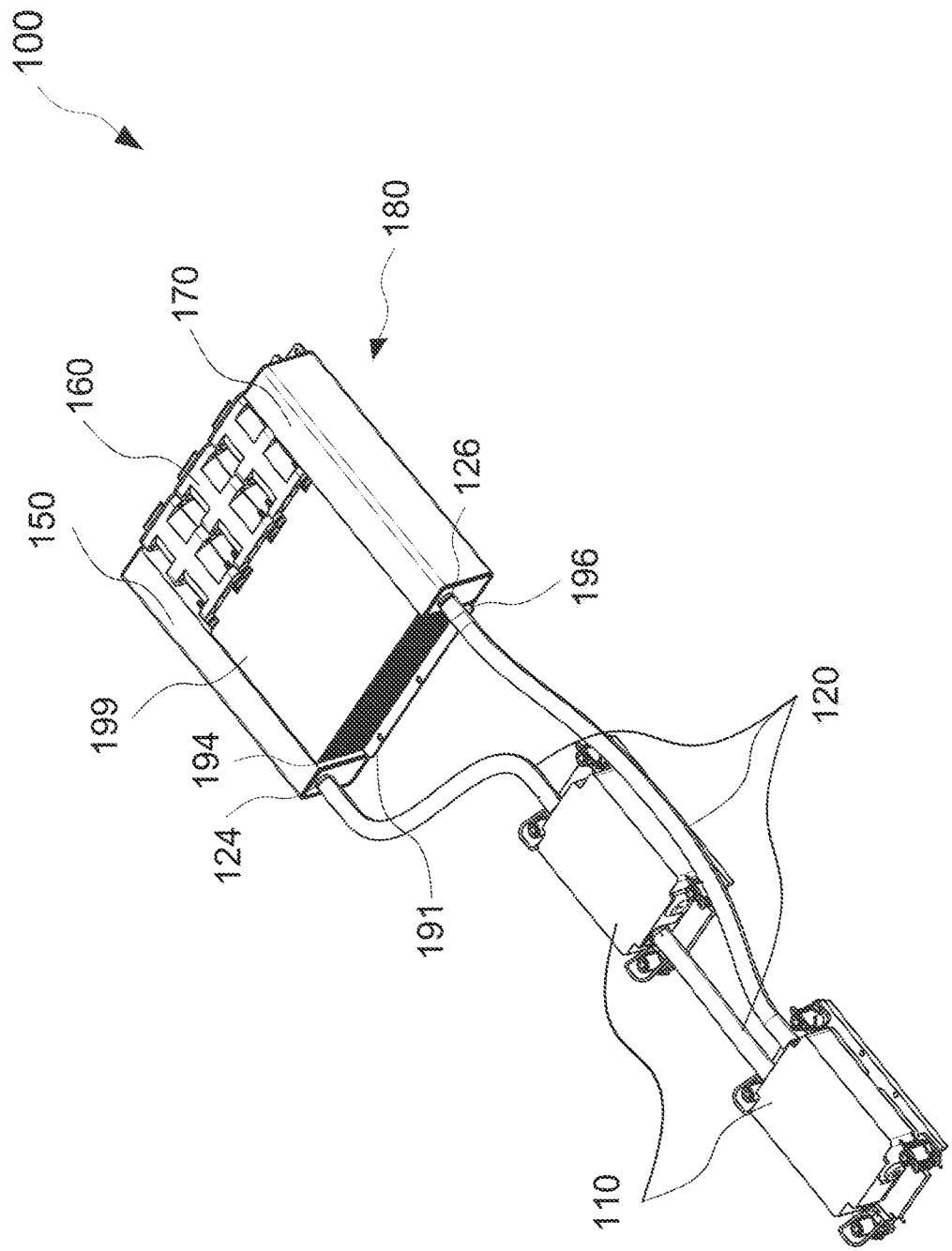
FIG. 1A is a schematic perspective view of a liquid cooling system, according to an exemplary embodiment.

The following describes various principles related to heat exchange systems by way of reference to specific examples of pumping units, fluid reservoirs, radiators, water blocks, and liquid cooling systems, including arrangements and examples of pumping units, fluid reservoirs, radiators, and water blocks embodying innovative concepts. More particularly, but not exclusively, such innovative principles are described in relation to selected examples of pumping units, fluid reservoirs, radiators, water blocks, and liquid cooling systems and well-known functions or constructions are not described in detail for purposes of succinctness and clarity. Nonetheless, as will be appreciated by one of ordinary skill in the art, one or more of the disclosed principles can be incorporated in various other embodiments of pumping units, fluid reservoirs, radiators, water blocks, and liquid cooling systems to achieve any of a variety of desired outcomes, characteristics, and/or performance criteria.

Thus, pumping units, fluid reservoirs, radiators, water blocks, and liquid cooling systems having attributes that are different from those specific examples discussed herein can embody one or more of the innovative principles, and can be used in applications not described herein in detail. Accordingly, embodiments of pumping units, fluid reservoirs, radiators, water blocks, and liquid cooling systems not described herein in detail also fall within the scope of this disclosure, as will be appreciated by those of ordinary skill in the relevant art following a review of this disclosure.

Exemplary embodiments described herein are directed to liquid cooling systems. The liquid cooling system extracts heat generated by one or more heat generating devices, as an example and not to be limiting, within a computer or server system. The heat generating devices include, but are not limited to, one or more central processing units (CPU), CPU chipsets, one or more graphics processing units (GPUs), and/or one or more physics processing units (PPUs), mounted on a motherboard and/or expansion card, or the like.

The liquid cooling system is preferably configured within an electronic component chassis or as part of an electronics system that includes heat generating devices to be cooled. The liquid cooling system includes at least one liquid-based cooling loop and a multi-fan unit. The multi-fan unit is coupled to a back end of a radiator of the liquid cooling system via a fastener (for example, bolts, screws, adhesive material, and the like) at a structural portion of the radiator, pulling air through the radiator to an air plenum of the electronic component chassis or electronics system or to an outside of the electronic component chassis or electronics system. Those of ordinary skill in the relevant art may readily appreciate that the type and size of fans may be varied, as long as air may be pulled through the radiator to an air plenum of the electronic component chassis or electronics system or to an outside of the electronic component chassis or electronics system.

In some embodiments, the multi-fan unit may be high pressure (that is, high airflow) fans. In some embodiments, the multi-fan unit may have reinforced fan blades. In some embodiments, the design of the fan blades and/or other components (such as bearings, and the like) may be such that noise generated during operation may be minimized. In some embodiments, the fans may be constructed using fasteners (such as anti-vibration rivets, gaskets, and the like) that may be used to minimized vibration during operation.

Each cooling loop includes a fluid-to-air heat exchanger or radiator having first and second built-in fluid tank reservoirs and at least one heat exchanger pump. The built-in fluid tank accounts for fluid loss over time due to permeation. The components in the cooling loop are coupled via a plurality fluid conduit. The radiator comprises at least one first flow port and at least one second flow port for attachment of the plurality of fluid conduits thereto for actively moving a cooling fluid to and from the at least one heat exchanger pump. Heat generated from a heat generating device is transferred to cooling fluid flowing through the at least one heat exchanger pump. The heated cooling fluid is output from the heat exchanger pump and input to the radiator. The heated cooling fluid flows to and through the radiator having first and second built-in fluid tank reservoirs and a plurality of heat exchanger fins. The cooling fluid flows from the radiator to the heat exchanger pump to once again begin the cooling loop. Although the cooling loop includes a heat exchanger pump, more than one heat exchanger pump may be coupled to the radiator. In this manner, multiple heat generating devices and/or a larger heat generating area may be cooled. Each of the heat exchanger pumps may be adjacently configured in rows or differently, allowing for design flexibility enabling application-specific configurations.

Figure 1B:
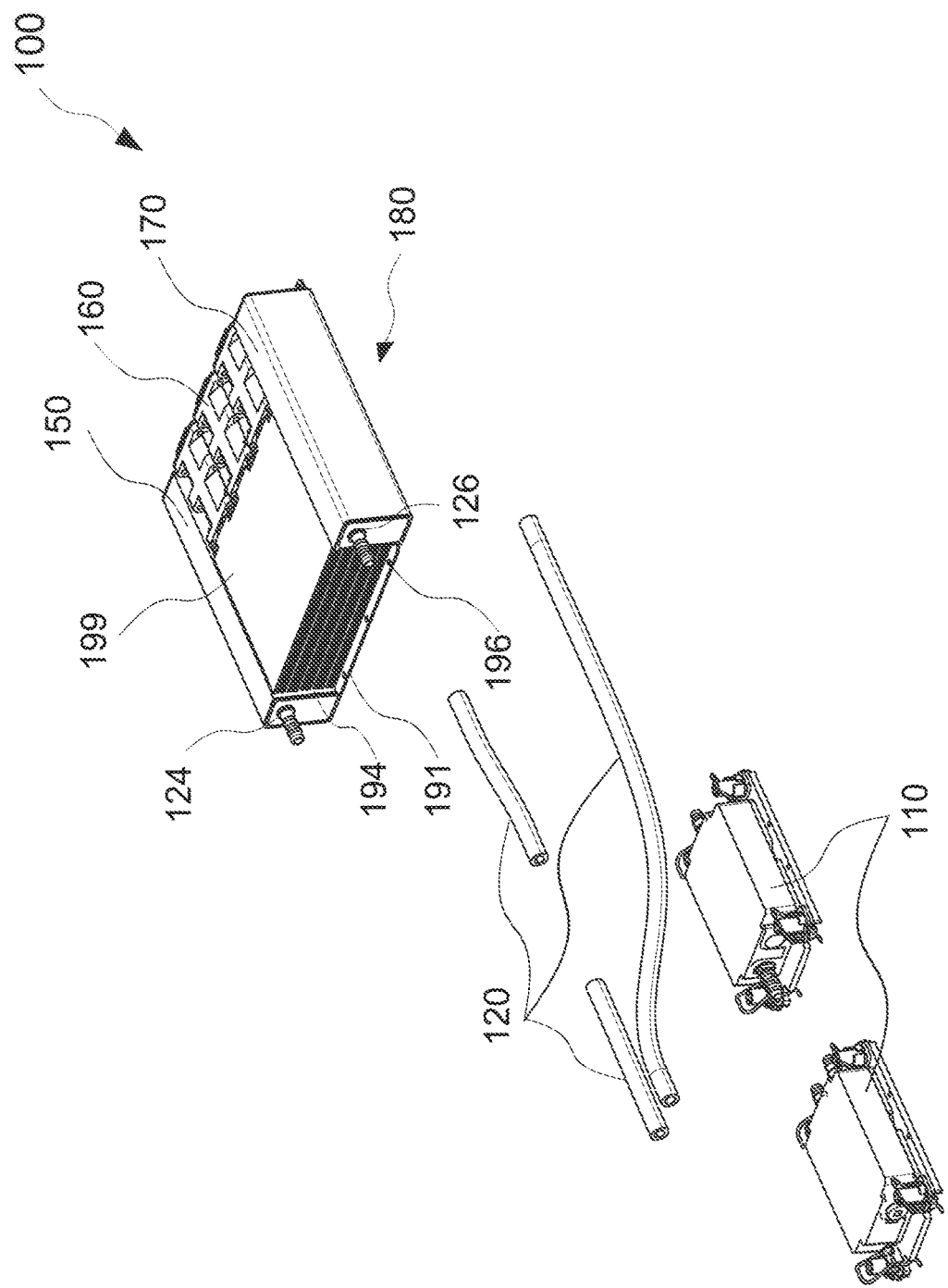
FIG. 1B is a partially exploded view of the liquid cooling system of FIG. 1A, according to the exemplary embodiment.
Figure 2A:
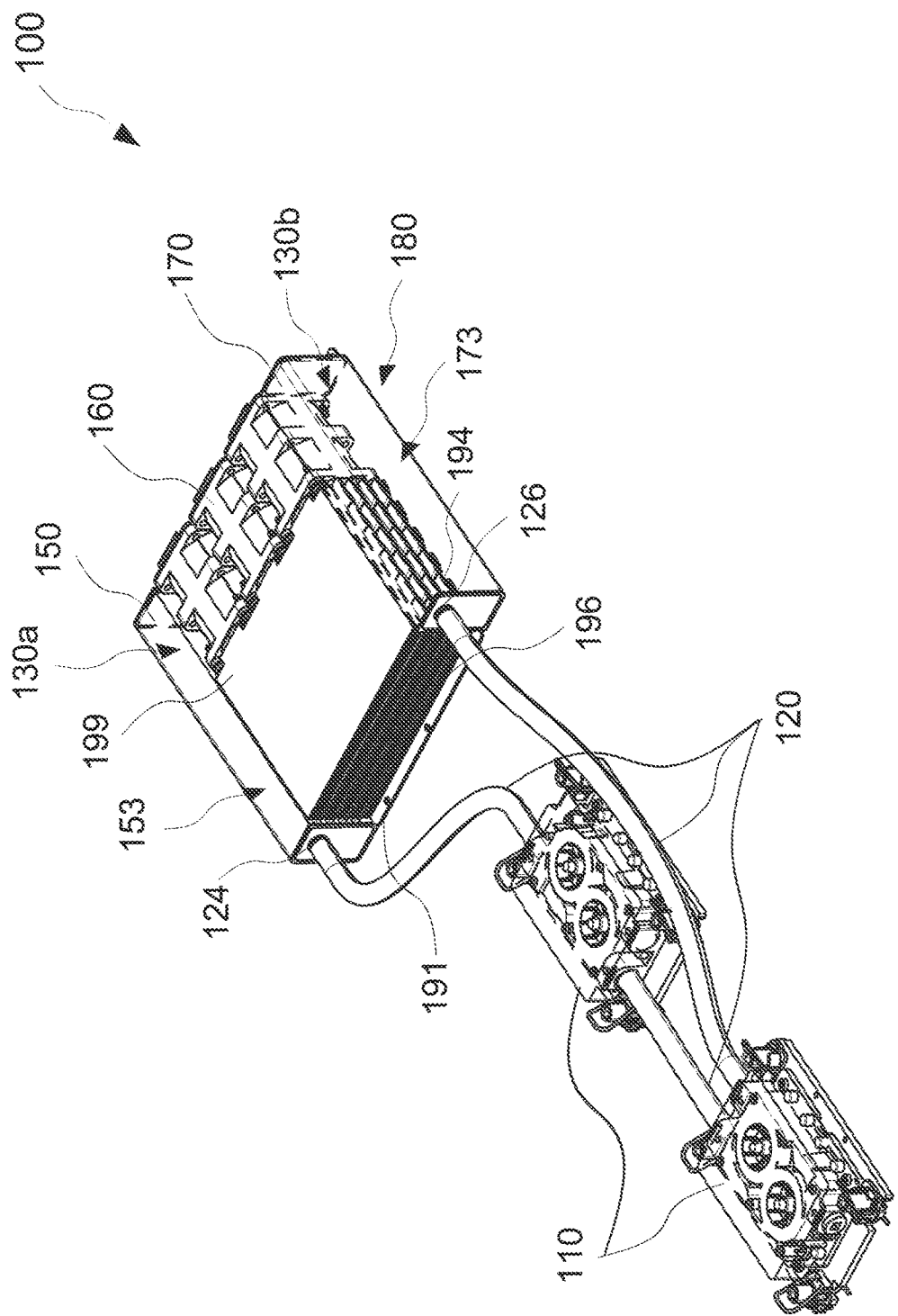
FIG. 2A is a cutaway perspective view illustrating the interior of one of the reservoirs and an end of the radiator of the liquid cooling system of FIG. 1A, according to an exemplary embodiment.
Figure 2B:
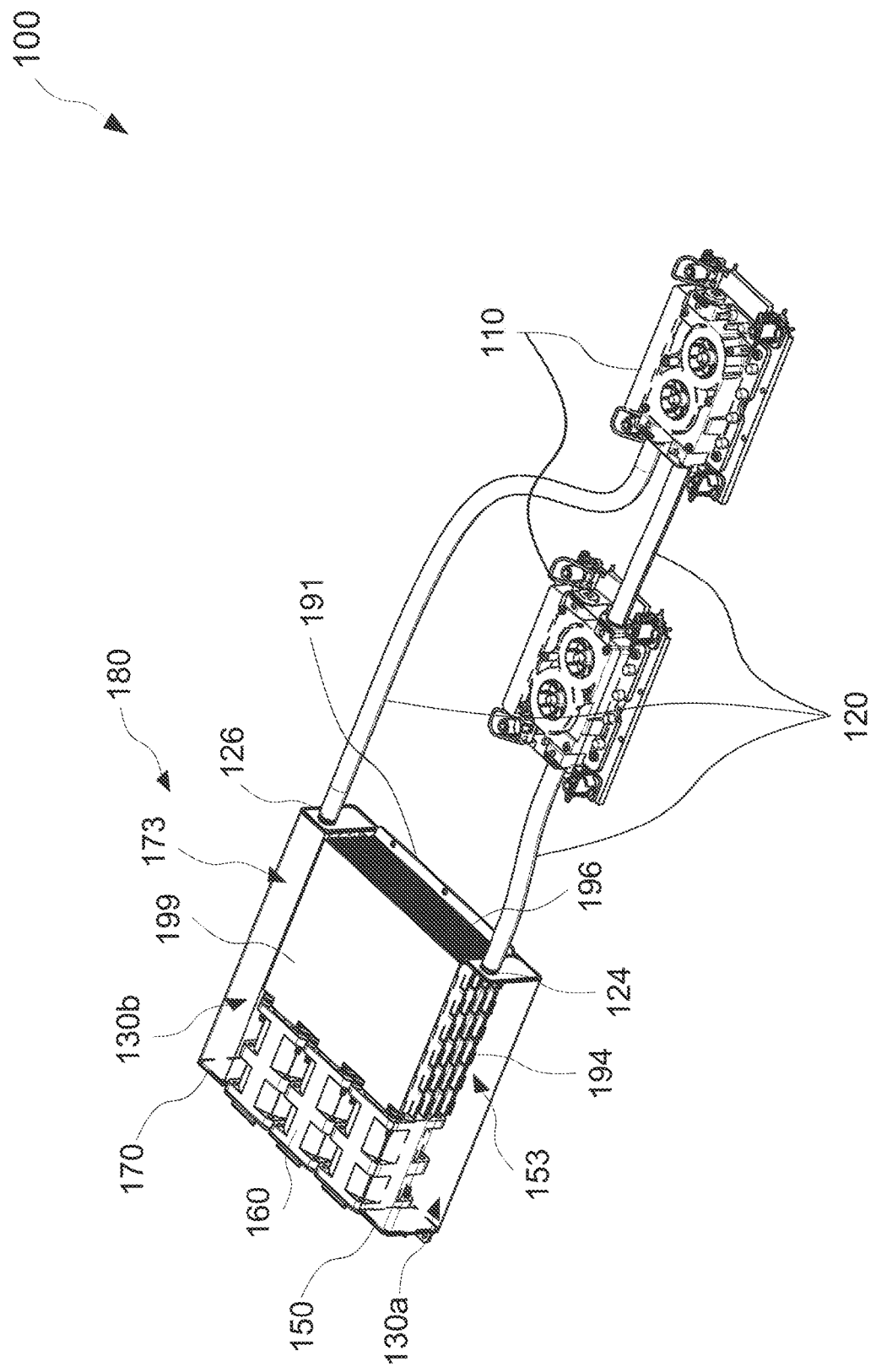
FIG. 2B is a cutaway perspective view illustrating the interior of another reservoir and another end of the radiator of the liquid cooling system of FIG. 1A, according to the exemplary embodiment.
Figure 3A:
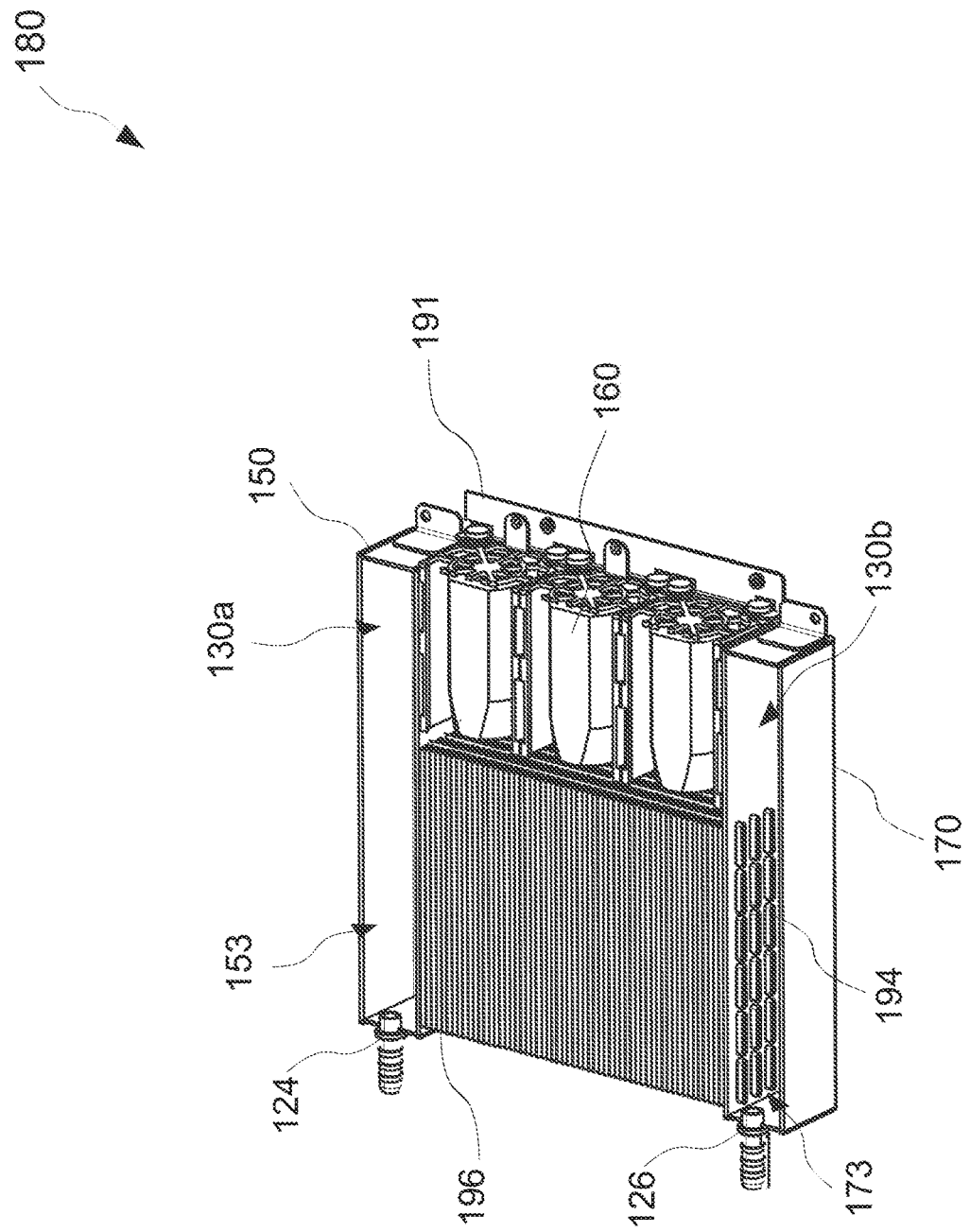
FIG. 3A is a perspective cutaway view illustrating the interior of one of the reservoirs and an end of the radiator of FIG. 1A, according to an exemplary embodiment.
Figure 3B:
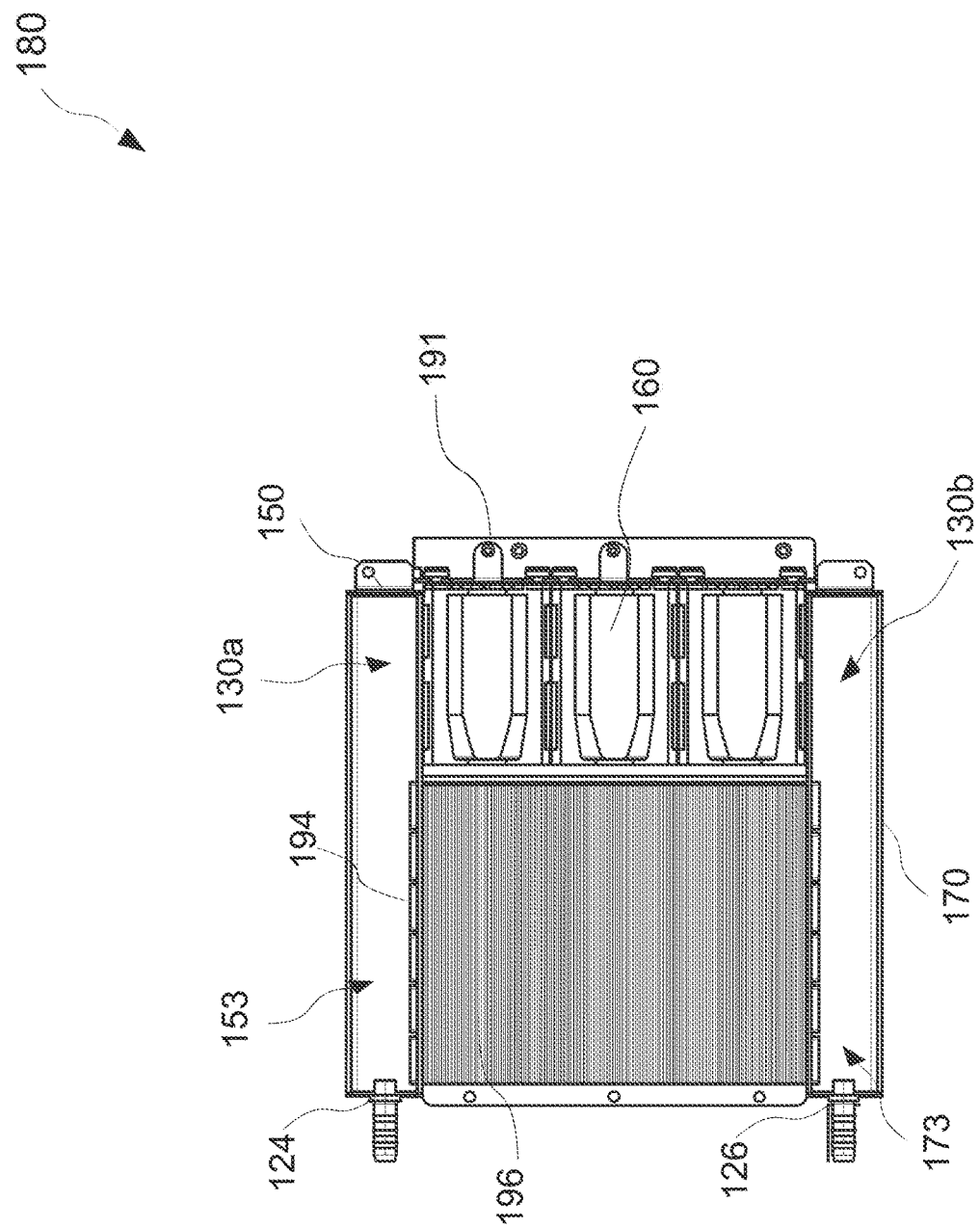
FIG. 3B is a top cutaway view illustrating the interiors of the reservoirs and both ends of the radiator of FIG. 1A, according to the exemplary embodiment.

FIG. 1A is a schematic perspective view of a liquid cooling system, according to an exemplary embodiment. FIG. 1B is a partially exploded view of the liquid cooling system of FIG. 1A, according to the exemplary embodiment. FIG. 2A illustrates the interior of the second end of the radiator of the liquid cooling of FIG. 1A, according to an exemplary embodiment. FIG. 2B illustrates the interior of the first and second end of the radiator of the liquid cooling of FIG. 1A, according to the exemplary embodiment. FIG. 3A illustrates the interior of the second end of the radiator of FIG. 1A, according to an exemplary embodiment. FIG. 3B illustrates the interior of the first and second end of the radiator of FIG. 1A, according to the exemplary embodiment. Referring to FIGS. 1A to 3B, a liquid cooling system 100 is provided, comprising a radiator 180 having first and second built-in fluid tank reservoirs 130a, 130b, a multi-fan unit 160, at least one heat exchanger pump 110 positioned on one side of the radiator 180, and a plurality of fluid conduits 120 coupling to the heat exchanger pump 110 and radiator 180. Heat generated from a heat generating device is transferred to cooling fluid flowing through the at least one heat exchanger pump 110 and output to the radiator 180. The heated cooling fluid flows to and through the radiator 180, whereby the multi-fan unit 160 expels heat therefrom. Cooling fluid flows from the radiator 180 to the at least one heat exchanger pump 110 to once again begin the cooling loop. The first and second built-in fluid tank reservoirs 130a, 130b account for fluid loss over time due to permeation. Although not illustrated for simplicity, it should be appreciated that a fill port may be included in each reservoir in order to permit refilling of the reservoirs as needed.

In some embodiments, the amount of the at least one heat exchanger pump 110 is two; however, the embodiments are not limited thereto. In alternative embodiments, one heat exchanger pump or more than two heat exchanger pumps may be provided. Those of ordinary skill in the relevant art may readily appreciate that the amount of the at least one heat exchanger pump 110 may be varied, as long as heat generated from a heat generating device may be transferred to cooling fluid flowing through the at least one heat exchanger pump 110, and then the cooling fluid may flow to the radiator 180, whereby the multi-fan unit 160 expels heat therefrom, and then be received once again by the at least one heat exchanger pump 110 to begin the cooling loop again.

In some embodiments, the at least one heat exchanger pump 110 pumps the cooling fluid from an inlet pump connector attached thereto, through a second far side pump and first near side pump of a flow-directing reservoir and past heat-dissipating fins in a second-level indented water block area of a second surface of a water block in thermal contact with the heat generating device to an outlet pump connector attached thereto.

The at least one heat exchanger pump 110 and plurality of fluid conduits 120, which may be manufactured from a plastic material, may be "metalized" in order to minimize fluid diffusion or evaporation of the fluid. The metal may be provided as a thin layer of metal coating provided on either or on both of the internal side or the external side of the plastic part. Generally, the same metal material is used throughout the cooling loop (including the radiator). The metal material is preferably, but not necessarily, copper. The plurality of fluid conduits 120 may be flexible and/or rigid.

The cooling fluid of the liquid cooling system may be any type of cooling fluid, including but not limited to water, water with additives such as anti-fungicide, water with additives for improving heat conducting or other special compositions of cooling fluids such as electrically non-conductive liquids or liquids with lubricant additives or anti-corrosive additives.

Control of the at least one heat exchanger pump 110 driven by an AC or DC electrical motor, preferably takes place by means of an operative system or like means of a computer or electronics system, wherein the computer or electronics system comprises a means for measuring load and/or temperature of one or more processors. Using the measurement performed by the operative system or a like system eliminates the need for special means for operating the pump. Communication between the operative system or a like system and a processor for operating the pump may take place along already established communication links in the computer system such as a USB-link. Thereby, a real-time communication between the cooling system and the liquid cooling system may be provided without any special means for establishing the communication.

Further control strategies utilizing the operative system or a like system of the computer system may involve balancing the rotational speed of the at least one heat exchanger pump 110 as a function of the cooling capacity needed. If a lower cooling capacity is needed, the rotational speed of the at least one heat exchanger pump 110 may be limited, thereby limiting the noise generated by the motor driving the at least one heat exchanger pump 110.

In some embodiments, the radiator 180 having the first and second built-in fluid tank reservoirs 130a, 130b further comprises a top encasement 199, a bottom encasement 191, and a plurality of longitudinal fluid channels 194 disposed therebetween in rows and columns. Those of ordinary skill in the relevant art may readily appreciate that the top and bottom encasements 199, 191 may include one or more intermediate encasements between the top and bottom encasements 199, 191 and the plurality of longitudinal fluid channels 194 and the top and bottom encasements 199, 191 may comprise a securing means to the plurality of longitudinal fluid channels 194, and the embodiments are not limited. Those of ordinary skill in the relevant art may also readily appreciate that the total amount, amount of rows, and amount of columns of the plurality of longitudinal fluid channels 194 may be varied, depending on the required level of heat extraction, the performance characteristics and amount of the at least one heat exchanger pump 110, and the available space within the electronic component chassis or electronics system for mounting of the liquid cooling system 100, as long as heat generated from a heat generating device may be transferred to cooling fluid flowing through the at least one heat exchanger pump 110, and then the cooling fluid may flow through the plurality of longitudinal fluid channels 194, whereby the multi-fan unit 160 expels heat therefrom, and then be received once again by the at least one heat exchanger pump 110 to begin the cooling loop again. In some embodiments, the total amount of the plurality of longitudinal fluid channels 194 of the radiator 180 is twenty-four, and the plurality of longitudinal fluid channels 194 is disposed in four rows and six columns. In some embodiments, the plurality of longitudinal fluid channels 194 is separated by spacing. The spacing between the rows is preferably larger than the spacing between the columns.

In some embodiments, a plurality of fin heatsinks 196 is transversely disposed across each of the adjacent spacing between the rows of the plurality of longitudinal fluid channels 194 and across each of the three columns of flow channels 194. In some embodiments, each plurality of fin heatsinks 196 is disposed at an angle, that is, not perpendicular, relative to each adjacent row of the plurality of longitudinal fluid channels 194; however the embodiments are not limited thereto. Those of ordinary skill in the relevant art may readily appreciate that each plurality of fin heatsinks 196 may not be disposed at an angle, be varied, or any combination thereof, depending on the required level of heat extraction, as long as each plurality of fin heatsinks 196 generally spans each of the adjacent spacing between the rows of the plurality of longitudinal fluid channels 194 and across each of the three columns of flow channels 194 so that air can be passed through the radiator 180 across the surfaces of the plurality of fin heatsinks 196 and plurality of longitudinal fluid channels 194 for convective heat transfer away from the radiator 180.

In some embodiments, the radiator 180 comprises a first chamber 150 having a first flow chamber 153, inside a first built-in fluid tank reservoir 130a, and at least one first flow port 124 in first flow chamber 153, and a second chamber 170 having a second flow chamber 173, inside a second built-in fluid tank reservoir 130b, and at least one second flow port 126 on second flow chamber 153, opposite the first flow port 124. The top encasement 199, bottom encasement 191, plurality of longitudinal fluid channels 194, and plurality of fin heatsinks 196 are disposed between the first flow chamber 153 and second flow chamber 173, and each of the plurality of longitudinal fluid channels 194 provide fluid communication between the first flow chamber 153 and second flow chamber 173. The multi-fan unit 160 is disposed between the first built-in fluid tank reservoir 130a and second built-in fluid tank reservoir 130b, and the first flow chamber 153 and second flow chamber 173 are in fluid communication between the first built-in fluid tank reservoir 130a and second built-in fluid tank reservoir 130b, respectively, via fluid channels 194. In some embodiments, a threaded fitting may be attached to the at least one first flow port 124 and at least one second flow port 126 for easy coupling of the plurality of fluid conduits 120 thereto, for cooling fluid flow of the cooling loop. In some embodiments, there is one first flow port 124 and one second flow port 126; however, the embodiments are not limited thereto. Those of ordinary skill in the relevant art may readily appreciate that the position of the first chamber 150 and second chamber 170 can be interchanged and the number of first flow ports 124 and second flow ports 126 can vary with the amount of the at least one heat exchanger pump 110, as long as heat generated from a heat generating device may be transferred to cooling fluid flowing through the at least one heat exchanger pump 110, and then the cooling fluid may flow to the radiator 180, whereby the multi-fan unit 160 expels heat therefrom, and then be received once again by the at least one heat exchanger pump 110 to begin the cooling loop again. In some embodiments, each of the at least one first flow port 124 opposite the at least one second flow port 126 are disposed along a same plane relative to the bottom encasement 191, near to the top encasement 199.

In some embodiments, the first chamber 150 further comprises at least one chamber separator separating the cooling fluid flow from each of the at least one first flow port 124 and communicating with the plurality of longitudinal fluid channels 194 via a water-tight seal for more efficient cooling fluid flow. Those of ordinary skill in the relevant art may readily appreciate that as the amount of the at least one heat exchanger pump 110 varies, so does the required fluid flow inlets and outlets, and the amount of the at least one chamber separator separating the cooling fluid flow from each of the at least one first flow port 124 and communicating with the plurality of longitudinal fluid channels 194, as long as the cooling fluid flow from each of the at least one first flow port 124 is separated by a water-tight seal for more efficient cooling fluid flow. It should be appreciated that when multiple pumps 110 are connected to the reservoir serially, one pair of ports 124, 126 are needed, but if multiple pumps 110 are connected in parallel, a corresponding number of pairs of ports 124, 126 are needed, unless a manifold is included to reduce the number of ports needed.

The first and second built-in fluid tank reservoirs 130a, 130b provide a chamber for storing cooling fluid. A volume of cooling fluid may be retained in the first and second built-in fluid tank reservoirs 130a, 130b during operation of the liquid cooling system 100. In some embodiments, a visible portion of the cooling fluid in the first and second built-in fluid tank reservoirs 130a, 130b via a transparent material may allow users to visually observe an amount of cooling fluid in the cooling loop, and determine when additional cooling fluid may need to be added to the liquid cooling system 100. No additional space is needed to be allocated for the first and second built-in fluid tank reservoirs 130a, 130b, fluid loss over time due to permeation may be mitigated, and heat generated from the sides of the multi-fan unit 160 is dissipated, increasing cooling loop efficiency of the liquid cooling system 100.

In some embodiments, the liquid cooling system 100 is positioned such that the radiator 180 is oriented horizontally.

In alternative embodiments, the liquid cooling system 100 may be positioned such that the radiator 180 is oriented in an angled plane.

In some embodiments, the flow direction of the cooling fluid through each of the plurality of longitudinal fluid channels 194 of the radiator 180 is the same. Generally, as the impeller of the at least one heat exchanger pump 110 spins and forces heated cooling fluid through an outlet pump connector, the heated cooling fluid flows through the plurality of fluid conduits 120 to each of the at least one first flow port 124 of the first chamber 150, and through the plurality of longitudinal fluid channels 194. As the heated cooling fluid flows through each of the plurality of longitudinal fluid channels 194, air is passed through the radiator 180 across the surfaces of the plurality of fin heatsinks 196 and plurality of longitudinal fluid channels 194 for convective heat transfer away from the radiator 180. The cooled cooling fluid may be 5 degrees cooler, 10 degrees cooler, 15 degrees cooler, or more, than the heated cooling fluid entering the first chamber 150. The cooled cooling fluid flows through the second chamber 170 and the at least one second flow port 126, through the plurality of fluid conduits 120, back to an inlet pump connector of the at least one heat exchanger pump 110 to once again begin the cooling loop. In some embodiments, the radiator 180 may have a heat exchange capacity of at least 350 watts, between a range of around 350 watts to about 500 watts, less than or equal to about 500 watts, and so on. Heat generated from the sides of the multi-fan unit 160 is dissipated, as in addition to accounting for fluid loss over time due to permeation, the first and second built-in fluid tank reservoirs 130a, 130b also transport heat away from the sides of the multi-fan unit 160.

Figure 4A:
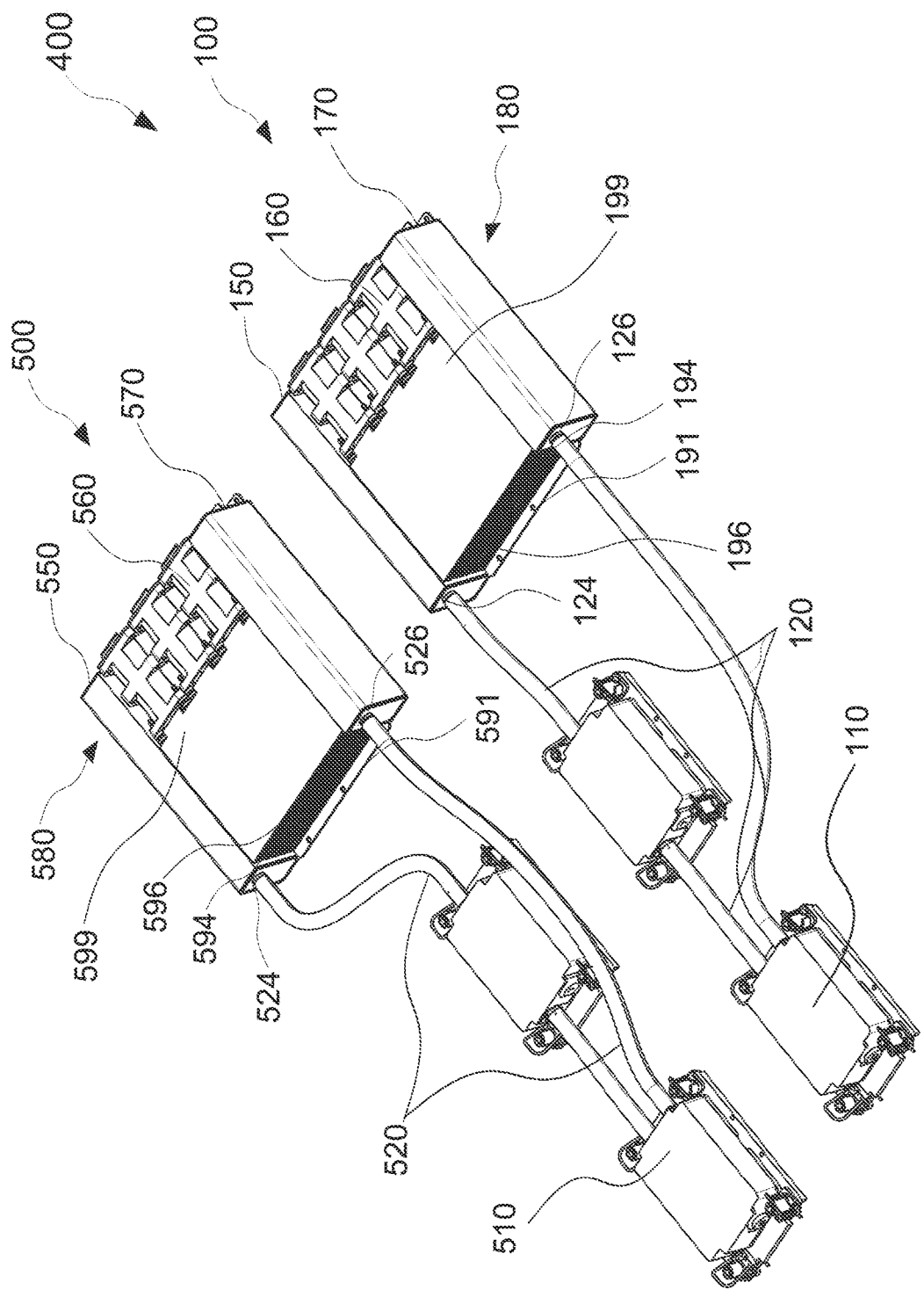
FIG. 4A is a schematic view of an alternative liquid cooling system, according to an exemplary embodiment.
Figure 4B:
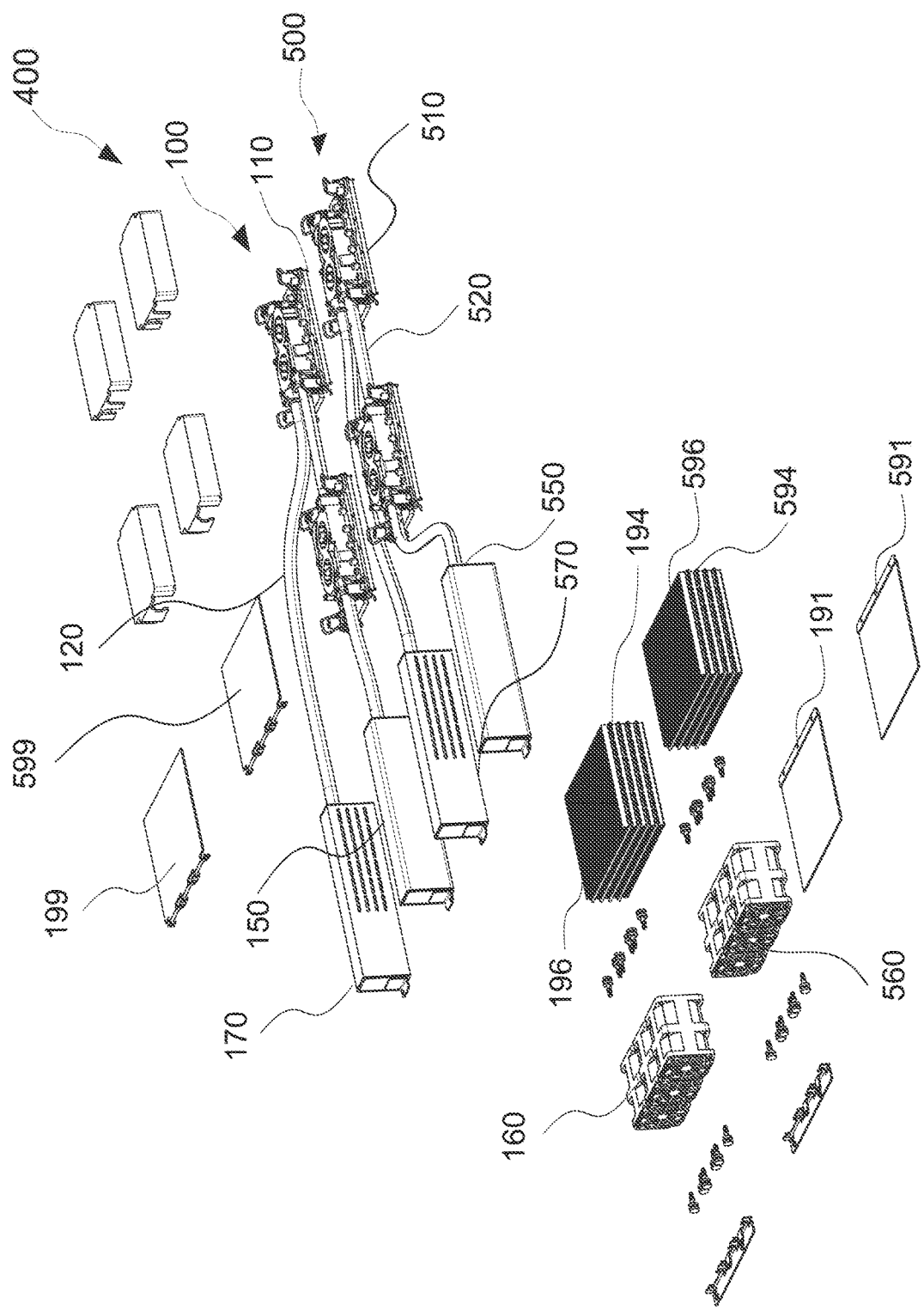
FIG. 4B is an exploded view of the alternative liquid cooling system of FIG. 4A, according to the exemplary embodiment.

In some embodiments, more than one liquid cooling system 100 may be employed to extract heat generated by one or more heat generating devices. FIG. 4A is a schematic view of an alternative liquid cooling system, according to another exemplary embodiment. FIG. 4B is an exploded view of the alternative liquid cooling system of FIG. 4A, according to the exemplary embodiment. Referring to FIGS. 4A and 4B, and referring to FIGS. 1A to 3B, a liquid cooling system 400 comprises two liquid cooling systems 100, 500, horizontally disposed. The elements and components of the liquid cooling systems 100, 500 are generally the same as previously described. Accordingly, reference may be made thereto, and repeated descriptions will not be made in the interest of brevity. The liquid cooling systems 100, 500 may be configured to cool each heat generating device included within a large area electronic component chassis or electronics system.

In some embodiments, the radiator may be made of a single piece of conductive material, such as copper; however, the embodiments are not limited thereto. Those of ordinary skill in the relevant art may readily appreciate that in alternative embodiments, other conductive materials may be used depending on application, dimensions, and available space.

In some embodiments, the at least one heat exchanger pump 110 may be fastened to a heat generating device by any suitable fastening means such as soldering, brazing or by means of thermal paste combined with glue. Alternatively, other fastening means may be provided for ensuring direct thermal contact between the free surface of the heat generating device and the liquid cooling system, such as a removable coupling means.

In some embodiments, the liquid cooling system is configured to cool each heat generating device included within an electronic component chassis or electronics system. In alternative embodiments, the liquid cooling system is configured to cool only select heat generating devices, or only a single heat generating device, while other heat generating devices are left to be cooled by other or complimentary means.

In the embodiments described herein, a liquid cooling system is provided. The liquid cooling system comprises a radiator having first and second built-in fluid tank reservoirs, a multi-fan unit, at least one heat exchanger pump, and a plurality of fluid conduits. Heat generated from a heat generating device is transferred to cooling fluid flowing through the at least one heat exchanger pump, and then output to the radiator. The heated cooling fluid flows through the radiator having the built-in fluid tank, cooling along a plurality of heat exchanger fins. The cooling fluid flows to the heat exchanger pump to once again begin the cooling loop. The built-in fluid tank not only accounts for fluid loss over time due to permeation, heat generated from the sides of the multi-fan unit is also dissipated. Additionally, the built-in fluid tank eliminates the need for separated assembly of a reservoir. Thus, it is no longer necessary to allocate for the positioning of the reservoir within the electronic component chassis or electronics system, decreasing total installation time, risks for leakage, and component placement problems.

The presently disclosed inventive concepts are not intended to be limited to the embodiments shown herein, but are to be accorded their full scope consistent with the principles underlying the disclosed concepts herein. Directions and references to an element, such as "up," "down,", "upper," "lower," "horizontal," "vertical," "left," "right," and the like, do not imply absolute relationships, positions, and/or orientations. Terms of an element, such as "first" and "second" are not literal, but, distinguishing terms. As used herein, terms "comprises" or "comprising" encompass the notions of "including" and "having" and specify the presence of elements, operations, and/or groups or combinations thereof and do not imply preclusion of the presence or addition of one or more other elements, operations and/or groups or combinations thereof. Sequence of operations do not imply absoluteness unless specifically so stated. Reference to an element in the singular, such as by use of the article "a" or "an", is not intended to mean "one and only one" unless specifically so stated, but rather "one or more". As used herein, "and/or" means "and" or "or", as well as "and" and "or." As used herein, ranges and subranges mean all ranges including whole and/or fractional values therein and language which defines or modifies ranges and subranges, such as "at least," "greater than," "less than," "no more than," and the like, mean subranges and/or an upper or lower limit. All structural and functional equivalents to the elements of the various embodiments described throughout the disclosure that are known or later come to be known to those of ordinary skill in the relevant art are intended to be encompassed by the features described and claimed herein. Moreover, nothing disclosed herein is intended to be dedicated to the public regardless of whether such disclosure may ultimately explicitly be recited in the claims. No element or concept disclosed herein or hereafter presented shall be construed under the provisions of 35 USC 112(f) unless the element or concept is expressly recited using the phrase "means for" or "step for".

In view of the many possible embodiments to which the disclosed principles can be applied, we reserve the right to claim any and all combinations of features and acts described herein, including the right to claim all that comes within the scope and spirit of the foregoing description, as well as the combinations recited, literally and equivalently, in the following claims and any claims presented anytime throughout prosecution of this application or any application claiming benefit of or priority from this application.

What is claimed is:

1. A liquid cooling system, comprising a radiator and at least one heat exchanger pump, wherein the radiator and at least one heat exchanger pump are connected by fluid conduits;
   wherein the radiator comprises a top encasement and a bottom encasement, first and second fluid reservoirs and a plurality of fluid channels arranged in an array comprising at least four rows and at least six columns in fluid communication between the first and second fluid reservoirs, and a plurality of radiator fins arranged between the plurality of fluid channels, wherein the plurality of fluid channels are arranged between the top encasement and the bottom encasement;
   wherein a space between the fluid channel rows is greater than a space between the fluid channel columns;
   wherein the radiator further comprises a multi-fan unit disposed between the first and second fluid reservoirs that forces air across the radiator fins to expel heat from fluid flowing within the plurality of fluid conduits;
   wherein the first and second fluid reservoir define length, width and height dimensions of the radiator and the multi-fan unit is located inside the length, width and height dimensions of the radiator; and
   wherein the radiator comprises a plurality of fin heatsinks disposed at an angle relative to the fluid channels such that the fin heatsinks are not perpendicular to the fluid channels.

2. The liquid cooling system of claim 1, comprising at least two heat exchanger pumps.

3. The liquid cooling system of claim 1, comprising an input port connecting a fluid conduit to the first fluid reservoir, and an output port connected a fluid conduit to the second fluid reservoir.

4. The liquid cooling system of claim 3, wherein the input port and the output port are threaded openings.

5. The liquid cooling system of claim 1, wherein the plurality of fluid channels are arranged in rows and columns.

6. The liquid cooling system of claim 2, wherein the at least two heat exchanger pumps are arranged in serial connection with the fluid conduits.

7. The liquid cooling system of claim 2, wherein the at least two heat exchanger pumps are arranged in parallel connection with the fluid conduits.

8. The liquid cooling system of claim 1, wherein the at least one heat exchanger pump has a thermal transfer surface adapted for connection to a heat generating device.

9. The liquid cooling system of claim 8, wherein the thermal transfer surface is connected to the heat generating device with thermal adhesive.

10. The liquid cooling system of claim 1, wherein the at least one heat exchanger pump is fastened to a heat generating device by soldering, brazing or thermal paste.

11. The liquid cooling system of claim 1, further comprising a plurality of fluid conduits connecting the radiator to a plurality of heat exchanger pumps.

12. The liquid cooling system of claim 1, wherein the radiator comprises copper.

13. The liquid cooling system of claim 1, wherein one or more of the radiator, fluid conduit and heat exchanger pump comprise plastic coated with metal.

14. The liquid cooling system of claim 1, wherein the first and second fluid reservoirs are filled with cooling fluid.

15. The liquid cooling system of claim 14, wherein the cooling fluid is pure water, or water with additives selected from the group consisting of anti-fungicide and additives for improving heat conductivity.

16. The liquid cooling system of claim 14, wherein the cooling fluid is electrically non-conductive.

17. The liquid cooling system of claim 14, wherein the cooling fluid is comprises lubricant additives or anti-corrosive additives.

18. The liquid cooling system of claim 1, further comprising a controller to control the at least one heat exchanger pump.

19. The liquid cooling system of claim 18, wherein the controller is programmed to balance a rotational speed of the at least one heat exchanger pump as a function of cooling capacity needed.

20. The liquid cooling system of claim 1, further comprising a second radiator and at least one second heat exchanger pump, wherein the second radiator and at least one second heat exchanger pump are connected by fluid conduits.

* * * * *